(12) United States Patent
Lin et al.

(10) Patent No.: US 12,456,639 B2
(45) Date of Patent: Oct. 28, 2025

(54) PICK-UP STRUCTURE FOR MEMORY DEVICE AND MANUFACTURING METHOD THEREOF

(71) Applicant: Winbond Electronics Corp., Taichung (TW)

(72) Inventors: Tsung-Wei Lin, Taichung (TW); Chun-Yen Liao, Taichung (TW); Kun-Che Wu, Taichung (TW); Cheng-Ta Yang, Taichung (TW); Chun-Sheng Wu, Taichung (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 568 days.

(21) Appl. No.: 17/751,130

(22) Filed: May 23, 2022

(65) Prior Publication Data
US 2023/0022941 A1    Jan. 26, 2023

(30) Foreign Application Priority Data
Jul. 23, 2021   (TW) .................................. 110127186

(51) Int. Cl.
| | | |
|---|---|---|
| *H01L 21/683* | (2006.01) | |
| *H01L 21/033* | (2006.01) | |
| *H01L 21/311* | (2006.01) | |
| *H01L 21/67* | (2006.01) | |
| *H01L 21/768* | (2006.01) | |

(Continued)

(52) U.S. Cl.
CPC ...... *H01L 21/6831* (2013.01); *H01L 21/0337* (2013.01); *H01L 21/31144* (2013.01); *H01L 21/76816* (2013.01)

(58) Field of Classification Search
CPC .......... H01L 21/78616; H01L 21/0337; H01L 21/0338; H01L 21/28123–2815; H01L 21/32139; H01L 21/76816; H10B 41/50; H10B 43/50
See application file for complete search history.

(56) References Cited

U.S. PATENT DOCUMENTS

| | | | | |
|---|---|---|---|---|
| 4,504,832 A | * | 3/1985 | Conte ..................... | G01D 5/252 340/870.37 |
| 11,121,138 B1 | * | 9/2021 | Chiu ..................... | H10B 10/125 |
| 2022/0359536 A1 | * | 11/2022 | Yang ..................... | H01L 27/092 |

FOREIGN PATENT DOCUMENTS

KR    10-2007-0092549 A    9/2007

\* cited by examiner

*Primary Examiner* — Joshua Benitez Rosario
*Assistant Examiner* — Moataz Khalifa
(74) *Attorney, Agent, or Firm* — Birch, Stewart, Kolasch & Birch, LLP (57) ABSTRACT

A pick-up structure for a memory device and method for manufacturing memory device are provided. The pick-up structure includes a substrate and a plurality of pick-up electrode strips. The substrate has a memory cell region and a peripheral pick-up region adjacent thereto. The pick-up electrode strips are parallel to a first direction and arranged on the substrate in a second direction. The second direction is different from the first direction. Each pick-up electrode strip includes a main part in the peripheral pick-up region and an extension part extending from the main part to the memory cell region. The main part is defined by fork-shaped patterns of a first mask layer. The extension part has a width (Continued)

less than that of the main part, and the extension part has a side wall surface aligned with a side wall surface of the main part.

15 Claims, 12 Drawing Sheets

(51) Int. Cl.
    *H10B 41/50*     (2023.01)
    *H10B 43/50*     (2023.01)

PICK-UP STRUCTURE FOR MEMORY DEVICE AND MANUFACTURING METHOD THEREOF

CROSS REFERENCE TO RELATED APPLICATIONS

This application claims priority of Taiwan Patent Application No. 110127186, filed on Jul. 23, 2021, the entirety of which is incorporated by reference herein.

BACKGROUND OF THE INVENTION

Field of the Invention

The disclosure is generally related to a semiconductor structure, and more particularly it is related to a pick-up structure for a memory device and a manufacturing method thereof.

Description of the Related Art

In the process of manufacturing semiconductor memory devices, the SADP process is configured to manufacture word lines, select gates, and pick-up electrodes connected to the corresponding word lines, which are small in size. When the overlay shift among the masks in different layers exceeds beyond the process tolerance, it is difficult for the widths of the select gates to reach the target size. In order to improve the overlap control, a high-resolution lithography process must be adapted. Without improving the overlap control, the select gate pattern can be defined before the sacrificial material layer is removed. However, when the pick-up electrodes are then defined, it is difficult for the widths of the pick-up electrodes to reach the target size. When contacts are manufactured above the pick-up electrodes, the yield and reliability of the memory device will be reduced. Therefore, it is necessary to discover a novel manufacturing method for the memory device, which can solve or improve upon the above-mentioned problems.

BRIEF SUMMARY OF THE INVENTION

A pick-up structure for a memory device is provided herein, which comprises a substrate and a plurality of pick-up electrode strips. The substrate has a memory cell region and a peripheral pick-up area adjacent thereto. The pick-up electrode strips are parallel to the first direction, extend along a second direction (which is different from the first direction) and are arranged on the substrate. Each of the pick-up electrode strips comprises a main part and an extension part. The main part is deposited in the peripheral pick-up area. The main part is defined by a plurality of fork-shaped patterns in a first mask layer. The extension part extends from the main part to the memory cell region. The extension part has a width less than a width of the main part and the extension part has a side wall surface aligned with a side wall surface of the main part.

According to an embodiment of the invention, each of the fork-shaped patterns comprises a first strip pattern, a second strip pattern, and a connection pattern, the first strip pattern and the second strip pattern are parallel to the first direction and extend along the second direction, and the connection pattern is configured to connect the first strip pattern and the second strip pattern. The first strip pattern and the second strip pattern are configured to define the main part.

According to an embodiment of the invention, a multi-layer resist structure covers the first strip pattern and the second strip pattern and is configured to form the extension part connecting the main part through the connection pattern. The first strip pattern and the second strip pattern form the main part.

According to an embodiment of the invention, the pick-up electrode strips at least comprise a first pick-up electrode strip, a second pick-up electrode strip, a third pick-up electrode strip, and a fourth pick-up electrode strip arranged along the second direction, wherein the main part of the pick-up electrode strip has the same width.

According to an embodiment of the invention, one of the fork-shaped patterns defines the first pick-up electrode strip and the second pick-up electrode strip and another of the fork-shaped patterns defines the third pick-up electrode strip and the fourth pick-up electrode strip.

According to an embodiment of the invention, the first pick-up electrode strip and the second pick-up electrode strip are symmetrically arranged with each other and the third pick-up electrode strip and the fourth pick-up electrode strip are symmetrically arranged with each other.

According to an embodiment of the invention, the extension part of the first pick-up electrode strip and the extension part of the second pick-up electrode strip are separated with a first length and the main part of the first pick-up electrode strip and the main part of the second pick-up electrode strip are separated with a second length, wherein the first length exceeds the second length.

According to an embodiment of the invention, the extension part of the third pick-up electrode strip and the extension part of the fourth pick-up electrode strip are separated with a third length and the main part of the third pick-up electrode strip and the main part of the fourth pick-up electrode strip are separated with a fourth length, wherein the third length exceeds the fourth length and the second length.

According to an embodiment of the invention, the extension part of the second pick-up electrode strip and the extension part of the third pick-up electrode strip are separated with a third length and the main part of the second pick-up electrode strip and the main part of the third pick-up electrode strip are separated with a fourth length, wherein the third length is equal to the fourth length and the second length.

According to an embodiment of the invention, the pick-up electrode strips at least comprise a first pick-up electrode strip, a second pick-up electrode strip, a third electrode strip, and a fourth electrode strip arranged along the second direction, wherein, the main part of the first pick-up electrode strip and the main part of the second pick-up electrode strip have the same first length, the main part of the third pick-up electrode strip and the main part of the fourth pick-up electrode strip have the same second length, wherein the first length exceeds the second length.

In another embodiment, a manufacturing method for a memory device comprises providing a substrate; sequentially forming a first mask layer, a sacrificial material layer, and a second mask layer on the substrate, wherein the substrate has a memory cell region and a peripheral pick-up region adjacent thereto; forming a first pattern and a second pattern in the second mask layer, wherein the first pattern corresponds to the memory cell region and comprises a plurality of first strip patterns and a plurality of second strip patterns parallel with one another, and the second pattern corresponds to the peripheral pick-up region and comprises a plurality of fork-shaped patterns connected to the plurality of second strip patterns, wherein each of the fork-shaped patterns comprises a third strip pattern, a fourth strip pattern, and a connection pattern, the third strip pattern and the fourth strip pattern are parallel to a first direction, and the connection pattern is configured to connect the third strip pattern and the fourth strip pattern; transferring the first pattern and the second pattern in the second mask layer to the sacrificial material layer so that the sacrificial material layer has the first strip patterns, the second strip patterns, and the fork-shaped patterns; removing the second mask layer having the first pattern and the second pattern; forming a plurality of spacer layers on the first mask layer so that there is a corresponding spacer layer on two opposite side walls of each of the first strip patterns and two opposite side walls of each of the second strip patterns in the sacrificial material layer; performing a first etching on the first mask layer by using the sacrificial material layer and the spacer layers as an etching mask; after the first etching, removing the sacrificial material layer to leave the spacer layers; and performing a second etching on the first mask layer by using the spacer layers as an etching mask so that the first mask layer has a third pattern.

According to an embodiment of the invention, the manufacturing method for the memory device further comprises, before the second etching, forming a multi-layer resist structure on the substrate to cover the spacer layers and the first mask layer so that the spacer layers and the multi-layer resist structure are configured as the etching mask during the second etching.

According to an embodiment of the invention, the multi-layer resist structure further covers the spacer layers of the first strip patterns, the third strip pattern, and the fourth pattern and the first mask layer so that the connection pattern is removed during the second etching.

According to an embodiment of the invention, the manufacturing method for the memory device further comprises, before sequentially forming the first mask layer, the sacrificial material layer, and the second mask layer on the substrate, forming a target layer on the substrate; and after forming the third pattern, transferring the third pattern to the target layer.

According to an embodiment of the invention, after transferring the third pattern to the target layer, a plurality of pick-up electrode strips parallel to a first direction are formed in the target layer corresponding to the peripheral pick-up region, and the pick-up electrode strips are arranged in a second direction that is different from the first direction on the substrate. Each of the pick-up electrode strips comprises a main part and an extension part. The main part is deposited in the peripheral pick-up region, wherein the main part is defined by the third strip pattern and the fourth strip pattern. The extension part extends from the main part to the memory cell region. The extension part has a width less than a width of the main part, and the extension part has a side wall surface aligned with a side wall surface of the main part, wherein the extension part is formed by etching the connection pattern. Each of the main parts of the pick-up electrode strips has the same width.

According to an embodiment of the invention, the pick-up electrode strips at least comprise a first pick-up electrode strip, a second pick-up electrode strip, a third pick-up electrode strip, and a fourth pick-up electrode strip sequentially arranged in the second direction, wherein, the main part of the first pick-up electrode strip and the main part of the second pick-up electrode strip have the same first length, the main part of the third pick-up electrode strip and the main part of the fourth pick-up electrode strip have the same second length, wherein the first length exceeds the second length.

BRIEF DESCRIPTION OF DRAWINGS

FIGS. 2A-2H, 3A-3H, and 4A-4H are cross-sectional views illustrating a memory device in each manufacturing stage in accordance with different embodiments of the invention, in which

DETAILED DESCRIPTION OF THE INVENTION

As shown in FIGS. 1, 2A, 3A, and 4A, a substrate 100 is provided with a memory cell area R1 and a peripheral pick-up area R2 adjacent to the memory cell area R1. A target layer 102, a hard mask layer 110, a sacrificial material layer 120, and a multi-layer mask structure are sequentially formed on the substrate 100 to cover the memory cell a R1 and the peripheral pick-up region R2 of the substrate 100. The target layer 102 may be a single layer or have a multi-layer structure. When the target layer 102 is a single layer, the material of the target layer 102 may include metal or other suitable conductive materials. In addition, when the target layer 102 has a multi-layer structure, the target layer 102 may include a conductive layer and one or more dielectric layers deposited above.

Figure 1:
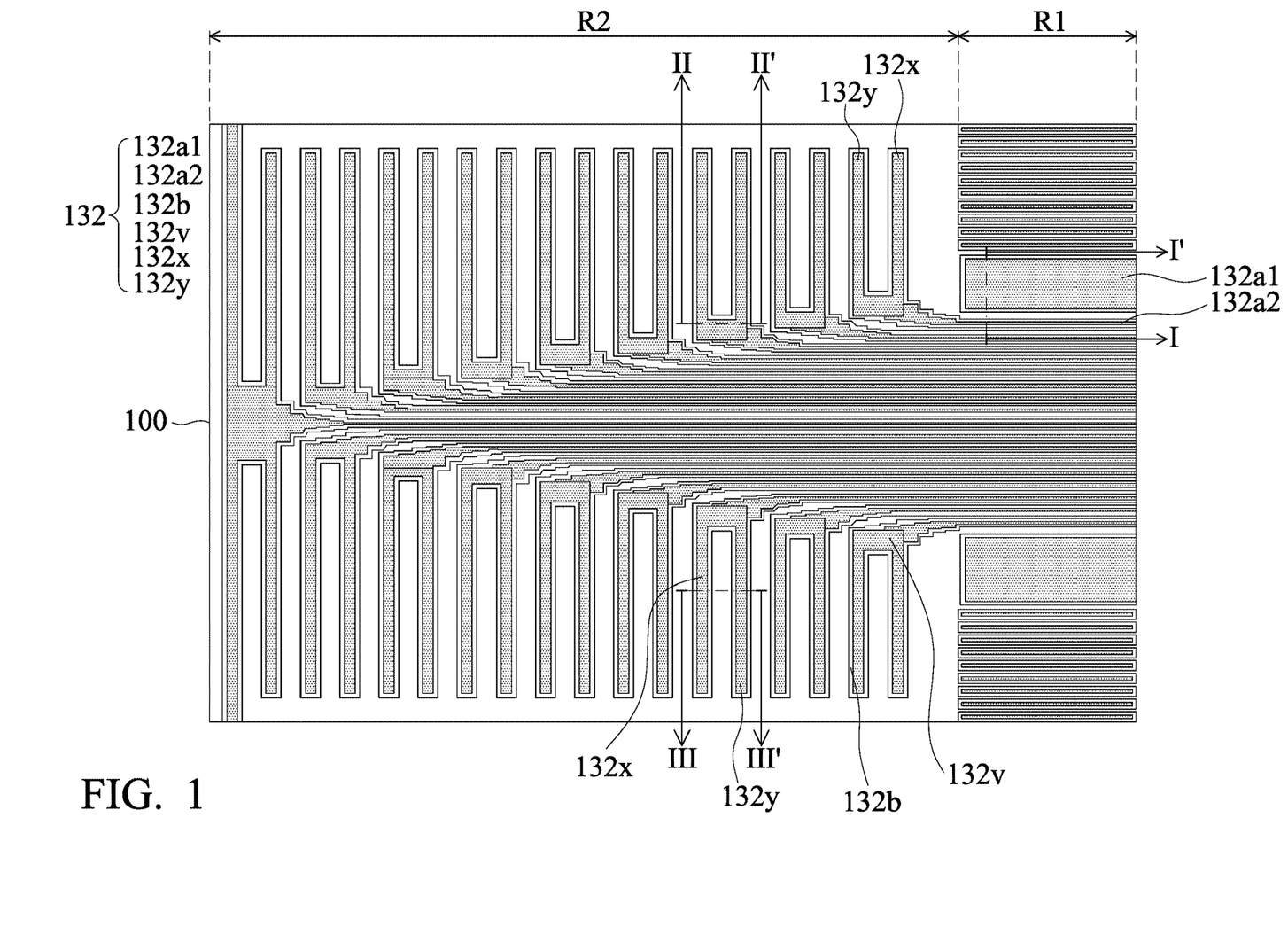
FIG. 1 is a top view of manufacturing a mask pattern layer of a memory device in accordance with an embodiment of the invention.
Figure 2A:
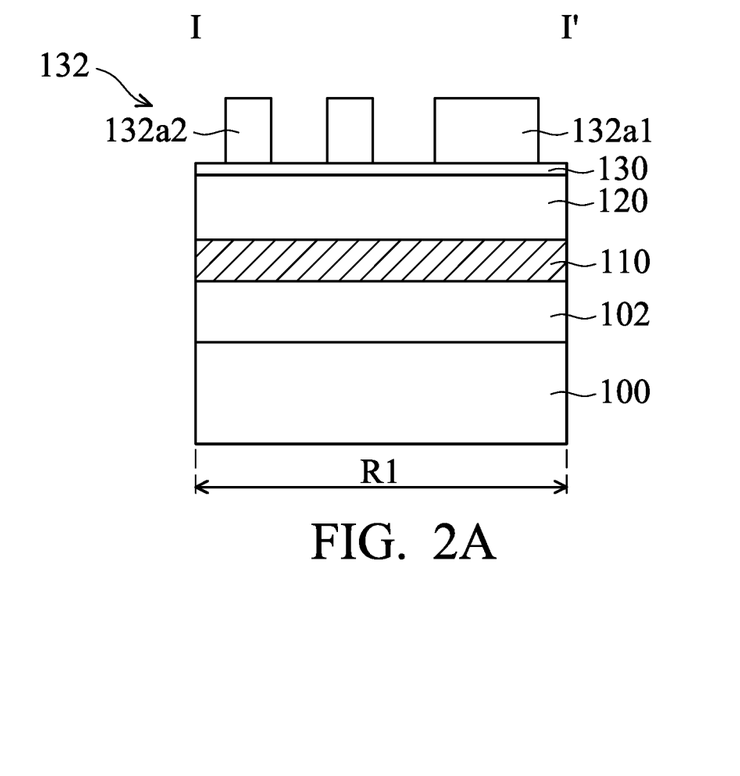
FIG. 2A is a cross-sectional view along line I-I' in FIG. 1.

The hard mask layer 110 may include polysilicon or other suitable mask materials. In addition, the sacrificial material layer 120 may include carbon or other suitable materials. The multi-layer mask structure includes a selective hard mask layer 130 and a mask pattern layer 132 (which is also referred to as a second mask layer) on the selective hard mask layer 130. The mask pattern layer 132 may include a photoresist material and may be formed through a photolithography process. The hard mask layer 130 may be configured as an anti-reflective layer, and may include silicon nitride, silicon oxynitride, or other suitable anti-reflective materials. The multi-layer mask structure serves as an etching mask for the subsequent etching process, and the mask pattern layer 132 has a first pattern and a second pattern which correspond to the memory cell region R1 and the peripheral pick-up region R2 of the substrate 100 respectively. Specifically, the first pattern includes a plurality of first strip patterns 132a1 and a plurality of second strip patterns 132a2 arranged in parallel. As shown in FIGS. 1 and 2A, the width of the first strip pattern 132a1 exceeds the width of the second strip pattern 132a2. The first strip pattern 132a1 is configured to define the selection gates of the memory device, and the second strip pattern 132a2 is used to define the word lines of the memory device.

In addition, the second pattern includes a plurality of fork-shaped patterns 132b (as shown in FIG. 1), in which the fork-shaped patterns 132b are correspondingly connected to the second strip-shaped patterns 132a2. As shown in FIG. 1, the fork-shaped pattern 132b further includes a connecting pattern 132v, a third strip pattern 132x, and a fourth strip pattern 132y. In some embodiments, the third strip pattern 132x and the fourth strip pattern 132y are configured to define part of the pick-up electrode strips in the memory device. As shown in FIG. 1, the third strip pattern 132x and the fourth strip pattern 132y are parallel to the first direction, extend in a second direction, which is different from the first direction, and are arranged on the substrate 100.

Figure 2B:
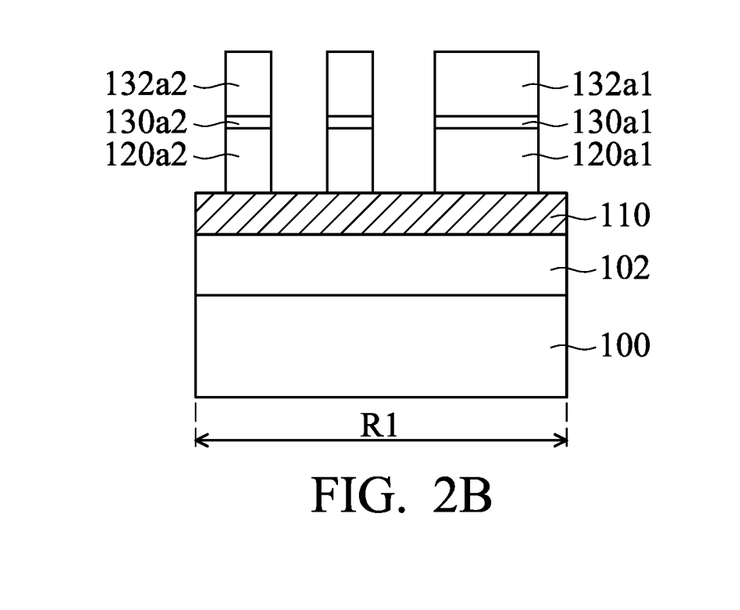

Next, referring to FIGS. 2B, 3B, and 4B, the first pattern and the second pattern of the mask pattern layer 132 are sequentially transferred to the hard mask layer 130 and the sacrificial material layer 120 below the mask pattern layer 132 to expose the upper surface of the hard mask layer 110. The hard mask layer 130 has a first strip pattern 130a1 and a plurality of second strip patterns 130a2 in the memory cell region R1 of the substrate 100, which correspond to the first strip pattern 132a1 and the second strip pattern 132a2 respectively. The sacrificial material layer 120 also has a first strip pattern 120a1 and a second strip pattern 120a2 in the memory cell region R1 of the substrate 100, which correspond to the first strip pattern 132a1 and a plurality of second strip patterns 132a2 respectively, as shown in FIG. 2B.

Figure 3A:
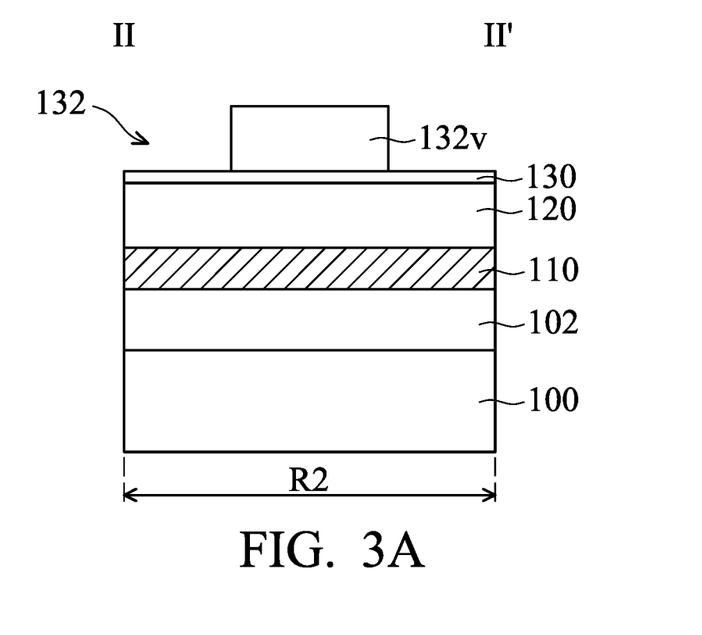
FIG. 3A is a cross-sectional view along line II-IF in FIG. 1.
Figure 3B:
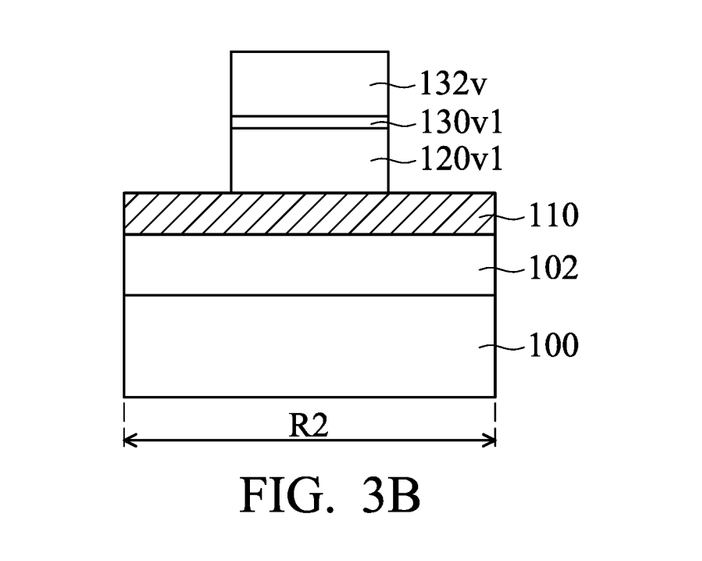
Figure 4A:
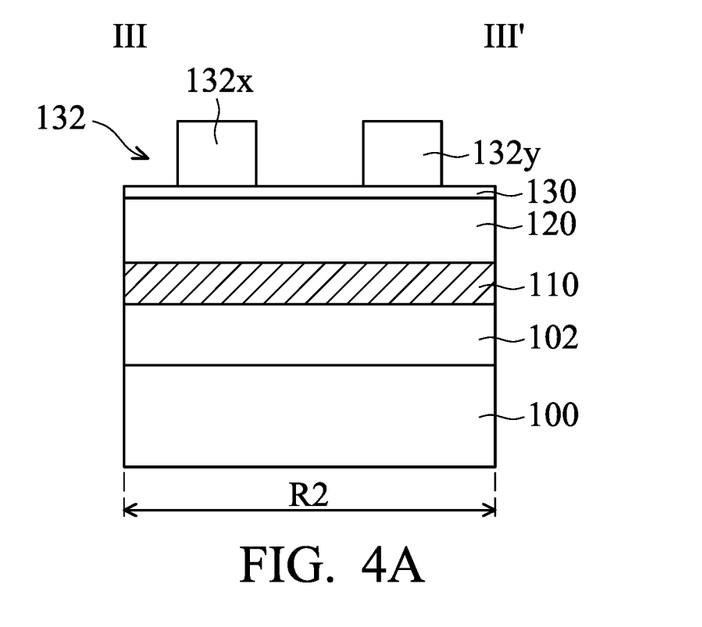
FIG. 4A is a cross-sectional view along line in FIG. 1.
Figure 4B:
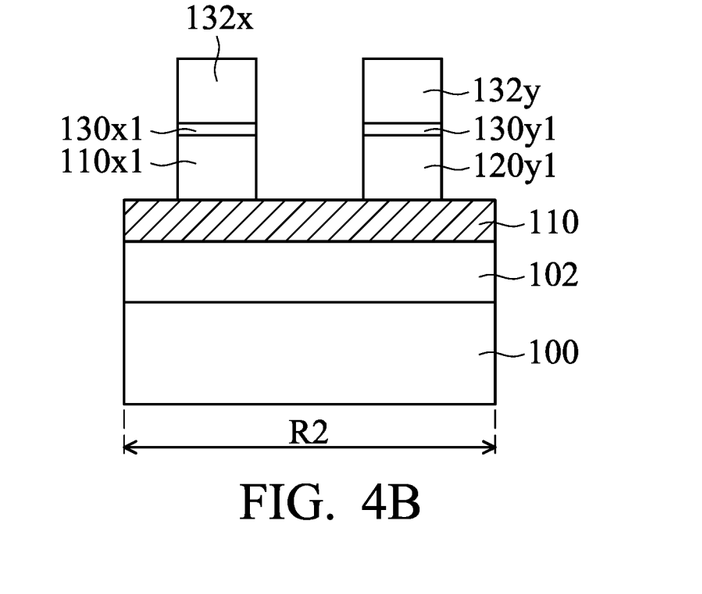

The hard mask layer 130 and the sacrificial material layer 120 respectively have a connection pattern 130v1 and a connection pattern 120v1 corresponding to the connection pattern 132v in the peripheral pick-up region R2 of the substrate 100, as shown in FIG. 3B. The hard mask layer 130 and the sacrificial material layer 120 respectively have a third strip pattern 130x1 and a third strip pattern 120x1 corresponding to the third strip pattern 132x and the fourth strip pattern 130y1 and the fourth strip pattern 120y1 corresponding to the fourth strip pattern 132y1 in the peripheral pick-up region R2 of the substrate 100, as shown in FIG. 4B. The hard mask layer 130 and the sacrificial material layer 120 may be formed through a suitable etching process.

Figure 2C:
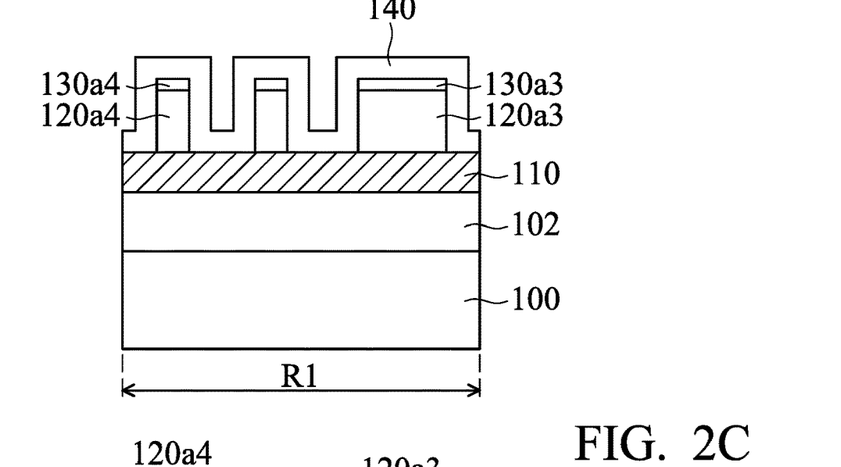
Figure 3C:
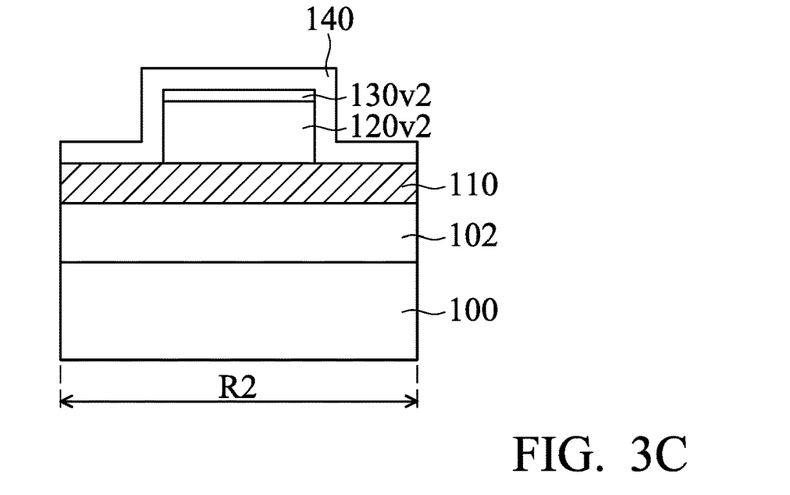
Figure 4C:
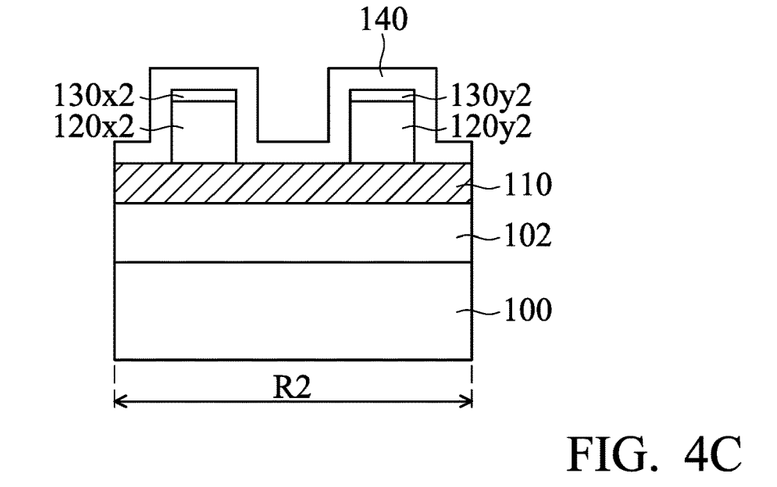

Referring to FIGS. 2C, 3C, and 4C, the mask pattern layer 132 having the first pattern and the second pattern is removed to expose the sidewalls and upper surfaces of the first strip pattern 130a1, the second strip pattern 130a2, the connecting pattern 130v1, the third pattern 130x1, and the fourth strip pattern 130y1 and the upper surface of the hard mask layer 110. In some embodiments, a selective trimming process may be performed to reduce the widths of the first strip patterns 130a1, 120a1, the second strip patterns 130a2, 120a2, the connection patterns 130v1, 120v1, the third strip patterns 130x1, 120x1, and the fourth strip patterns 130y1 and 120y1. After the trimming process is performed, the trimmed first strip patterns 130a3 and 120a3 and the trimmed second strip patterns 130a4 and 120a4 are formed in the memory cell region R1 of the substrate 100 (as shown in FIG. 2C). The trimmed connection patterns 130v2 and 120v2 are formed in the peripheral pick-up area R2 of the substrate 100 (as shown in FIG. 3C), and the trimmed third strip pattern 130x2, 120x2 and a fourth strip pattern 130y2, 120y2 in the peripheral pick-up area R2 of the substrate 100 (as shown in FIG. 4C). After that, a spacer material liner 140 is formed on the substrate 100 to compliantly cover the structure obtained after the trimming process.

Figure 2D:
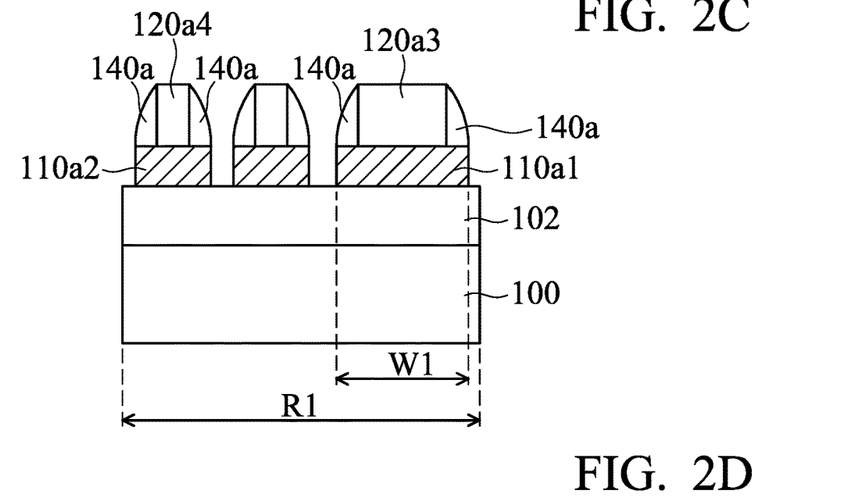
Figure 3D:
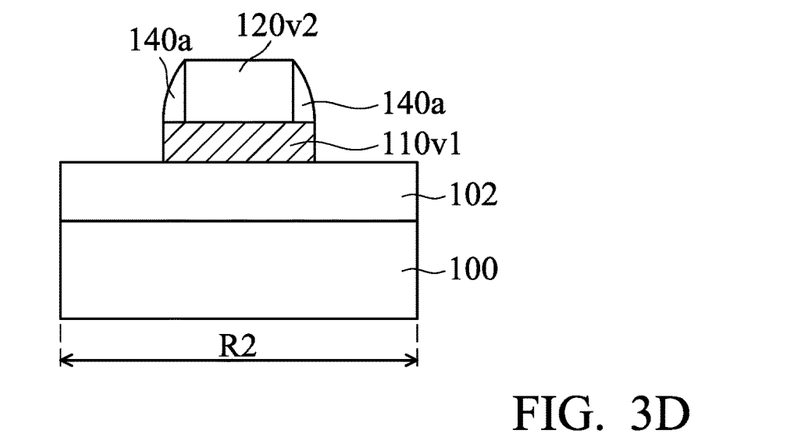
Figure 4D:
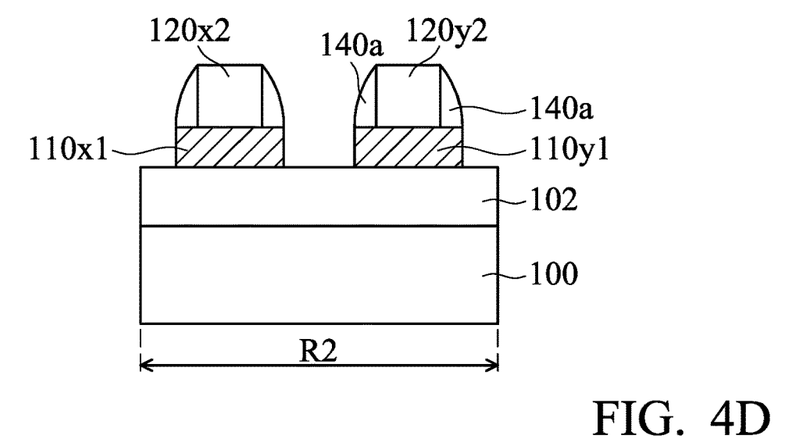

Next, referring to FIGS. 2D, 3D, and 4D, a plurality of spacer layers 140a are formed on the hard mask layer 110 by etching the spacer material liner 140. For example, an anisotropic etching process is performed on the spacer material layer 140, so that the opposite sidewalls of the trimmed first strip pattern 120a3 the trimmed second strip pattern 120a4, the trimmed connecting pattern 120v2, the trimmed third strip pattern 120x2, and the trimmed fourth strip pattern 120y2 of the patterned sacrificial material layer 120 have corresponding spacer layers 140a. After that, the patterned hard mask layer 130 is removed from the top of the patterned sacrificial material layer 120. That is, the trimmed first strip pattern 130a3, the trimmed second strip pattern 130a4, the trimmed connecting pattern 130v2, the trimmed third strip pattern 130x2, and the trimmed fourth strip pattern 130y2 are removed to expose the trimmed first strip pattern 120a3, the trimmed second strip pattern 120a4, the trimmed connecting pattern 120v2, the trimmed third strip pattern 120x2, and the trimmed fourth strip pattern 120y2. Since the trimmed connecting pattern 120v2 in the peripheral pick-up region R2 of the substrate 100 is connected to the trimmed third strip pattern 120x2 and the trimmed fourth strip pattern 120y2, two adjacent spacer layers 140a deposited between two adjacent trimmed connecting patterns 120v2 are connected to each other. In some embodiments, although it is not illustrated, the above-mentioned connected spacer layers 140a may be further patterned to ensure that two adjacent spacer layers 140a deposited between two adjacent trimmed connecting patterns 120v2 are separated from each other.

After that, using the patterned sacrificial material layer 120 and the spacer layers 140a together as the etching mask, an etching process is performed on the hard mask layer 110 to expose part of the upper surface of the target layer 102. The etching process first defines the select gate pattern in the memory cell region R1. Specifically, the first strip pattern 110a1 and the second strip pattern 110a2 are formed in the hard mask layer 110 in the memory cell region R1 of the substrate 100 by the etching process (as shown in FIG. 2D). In the hard mask layer 110 of the peripheral pick-up area R2 of the substrate 100 (as shown in FIG. 3D), a connecting pattern 110v1, a third strip pattern 120y2, and a fourth strip pattern 110y1 (as shown in FIG. 4D) are formed. In some embodiments, the first strip pattern 110a1 corresponding to the memory cell region R1 is configured as the select gate pattern, and the width W1 of the first strip pattern 110a1 is substantially equal to the target width of the selection gate pattern.

Figure 2E:
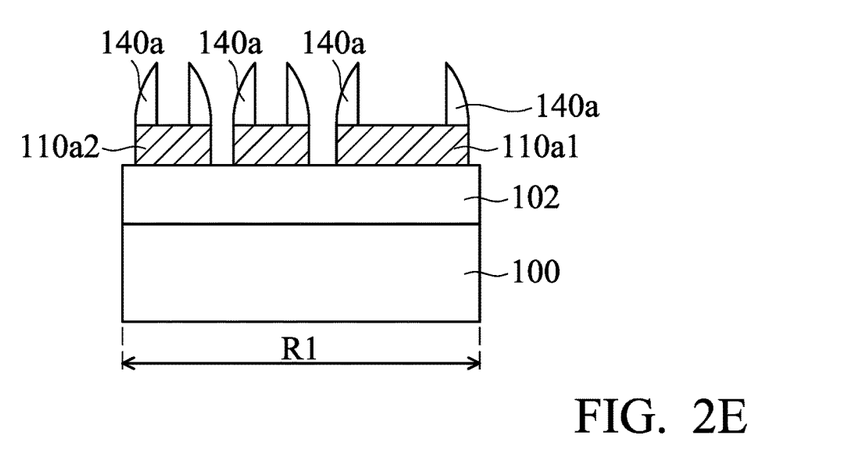
Figure 3E:
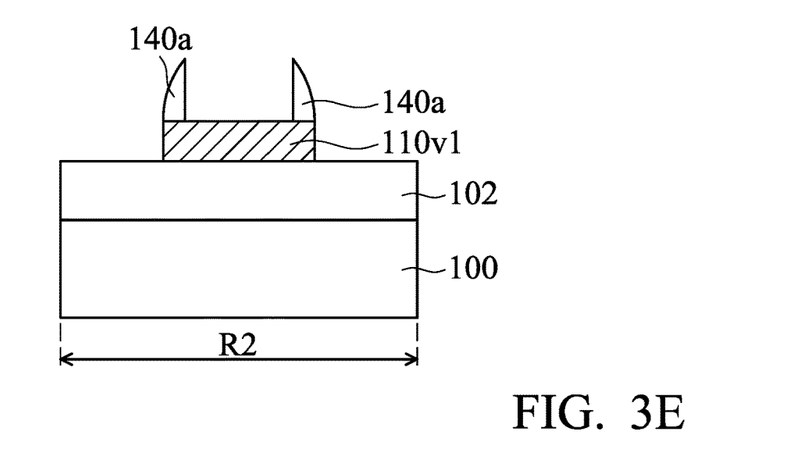
Figure 4E:
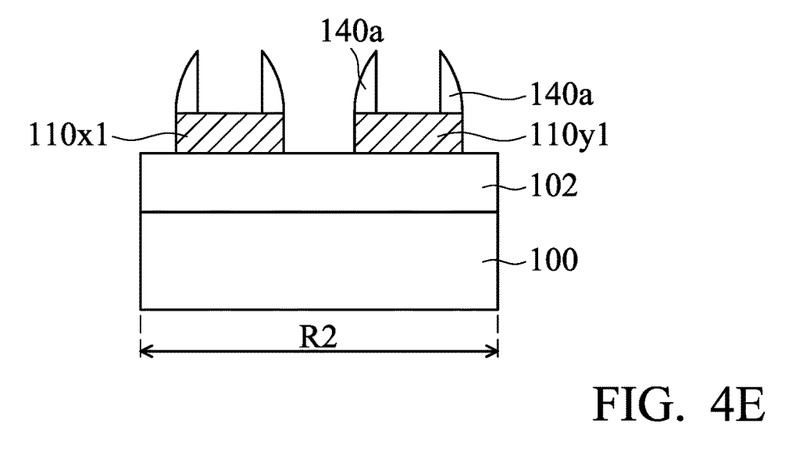

Next, the patterned sacrificial material layer 120 having the trimmed first strip pattern 120a3, the trimmed second strip pattern 120a4, the trimmed connecting pattern 120v2, the trimmed third strip pattern 120x2, and the trimmed fourth strip pattern 120y2 in FIGS. 2D, 3D, and 4D are removed to leave the spacer layers 140a on the patterned hard mask layer 110, in which the resulting structure is shown in FIGS. 2E, 3E, and 4E. The removal steps may be performed through a suitable etching process.

Figure 2F:
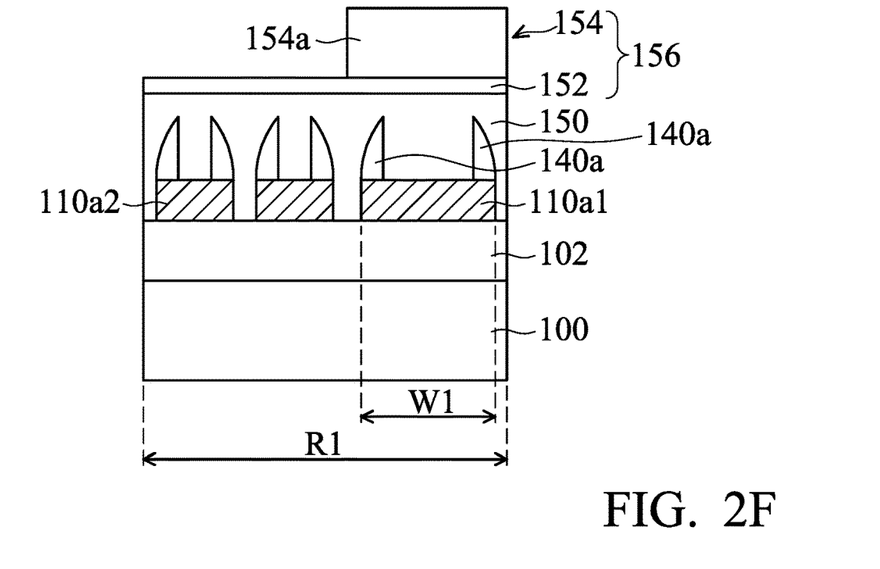
Figure 3F:
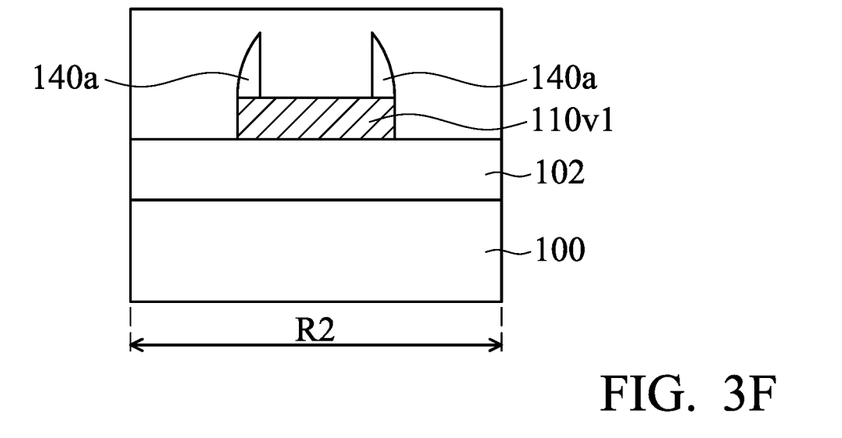
Figure 4F:
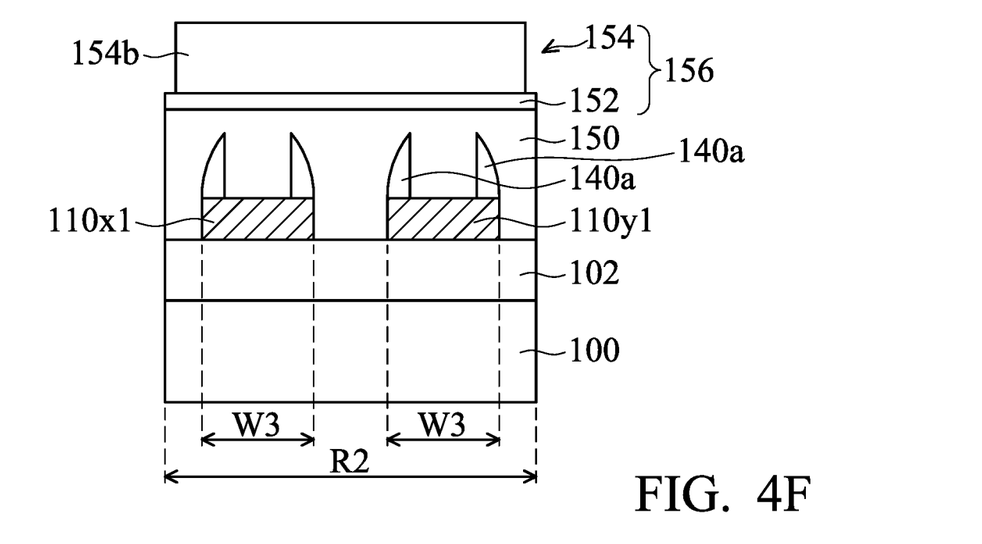

Next, referring to FIGS. 2F, 3F, and 4F, a mask structure 156 is formed on the substrate 100, covering the spacer layers 140a and the patterned hard mask layer 110, in which the mask structure 156 does not cover the connecting pattern 110v1 in FIG. 3F. After the mask structure 156 is patterned, the mask structure 156 serves as an etching mask for subsequently etching the patterned hard mask layer 110. The mask structure 156 is a multi-layer resist structure. For example, the multi-layer resist structure is a three-layer resist structure and may include a bottom layer 150, an intermediate layer 152, and a top pattern layer 154.

The bottom layer 150 can be configured as a flat layer to form a substantially flat upper surface above the structure shown in FIGS. 2F and 4F. The bottom layer 150 may be a spin on carbon (SOC) layer or other materials with anti-reflective properties. The intermediate layer 152 may provide the characteristic of a hard mask to the top pattern layer 154 deposited above the intermediate layer 152, and the material of the intermediate layer 152 may include silicon oxide, silicon nitride, silicon carbide or other suitable mask materials. In addition, the top pattern layer 154 has a seventh strip pattern 154a similar to and corresponding to the first strip pattern 110a1 serving as the select gate pattern, as shown in FIG. 2F. The seventh strip pattern 154a exposes the region to form the word lines in the memory cell region R1 (not shown), and serves as an etching stop region to prevent the select gate pattern below the seventh strip pattern 154a from being etched during subsequent etching. In this way, the width of the select gate pattern (i.e., the first strip pattern 110a1) can be kept unchanged. The top pattern layer 154 corresponding to the peripheral pick-up area R2 has a large area of a non-pattern 154b (as shown in FIG. 4F) for retaining the patterns defined by the third strip pattern 110x1 and the fourth strip pattern 110y1. The top pattern layer 154 may include a photoresist material and may be formed through a photolithography process.

Figure 2G:
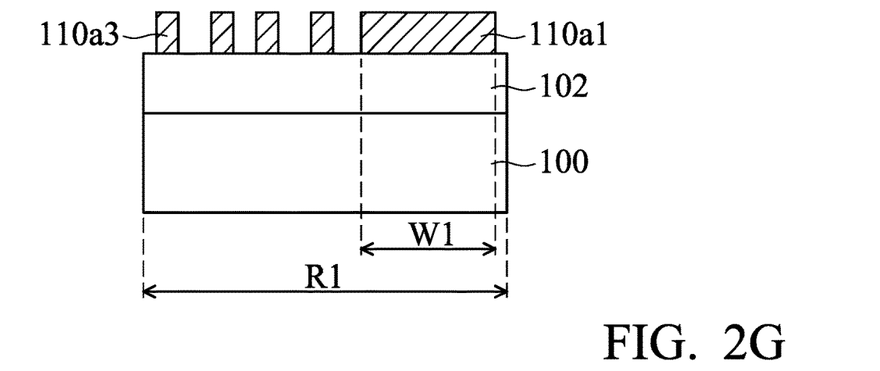
Figure 3G:
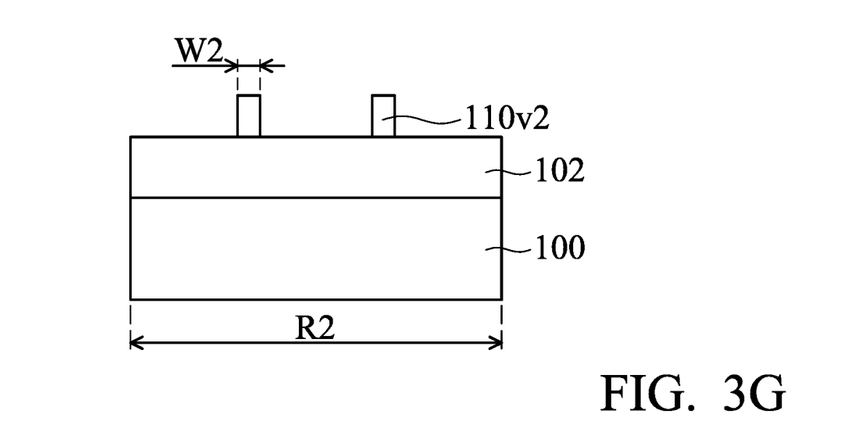
Figure 4G:
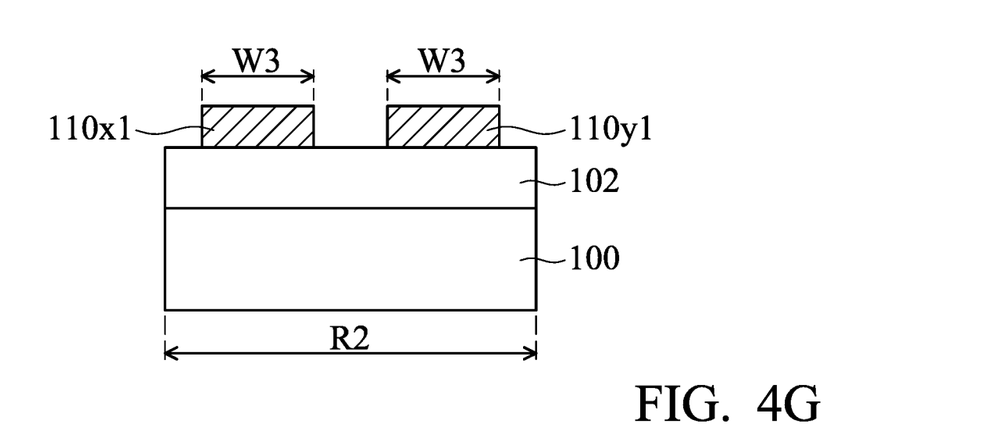

Next, referring to FIGS. 2G, 3G, and 4G, the remaining spacer layers 140a and the multi-layer resist structure 156 serve as an etching mask so that the patterned hard mask layer 110 is etched to expose the upper surface of the underlying target layer 102. The hard mask layer 110 is then patterned again to form a third pattern therein. After etching, the remaining bottom layer 150, intermediate layer 152, and top pattern layer 154 are removed.

The third pattern includes the fifth strip pattern 110a3 (i.e., the word line pattern) corresponding to the memory cell region R1 and the previously formed first strip pattern 110a1 (i.e., the select gate pattern), as shown in the FIG. 2G. The width of the fifth strip pattern 110a3 is substantially determined by the width of the spacer layers 140a, and the width of the spacer layers 140a is controlled by the thickness of the spacer material 140. The third pattern also includes a sixth strip pattern 110v2 (as shown in FIG. 3G), a third strip pattern 110x1, and a fourth strip pattern 110y1 (as shown in FIG. 4G) corresponding to the peripheral pick-up region R2. The sixth strip pattern 110v2 is configured to connect the third strip pattern 110x1 and the fourth strip pattern 110y1 to the word line of the memory device, in which the third strip pattern 110x1 and the fourth strip pattern 110y1 together constitute the pick-up electrode pattern.

As shown in FIGS. 2F and 2G, the select gate pattern has been defined in the hard mask layer 110 in advance. Therefore, after the hard mask layer 110 is etched with the seventh strip pattern 154a as an etching mask, even if the overlay shift is occurred between the seventh strip pattern 154a and the spacer layers 140a below, the first width W1 of the first strip pattern 110al, which is configured as the selected gate pattern, remains unchanged. The overlap tolerance may be effectively improved in the subsequent manufacturing process by defining the selective gate pattern in advance.

As shown in FIGS. 3F and 3G, during the select gate pattern (i.e., the first strip pattern 110a1) formed on the hard mask layer 110 in the memory cell region R1 of the substrate 100, the connecting pattern 110v1 is simultaneously formed in the peripheral pick-up region R2 of the substrate 100. Therefore, after the hard mask layer 110 is etched with the spacer layers 140a as the etching mask, the second width W2 of the sixth strip pattern 110v2 is substantially equal to the width of the spacer layers 140a.

As shown in FIGS. 4F and 4G, the pick-up electrode pattern has been defined by the third strip pattern 110x1 and the fourth strip pattern 110y1 in the hard mask layer 110 in advance. Therefore, after a large area of the non-pattern 154b is configured as the etching mask for etching the hard mask layer 110, even if there is a misalignment between the non-pattern 154b and the spacer layers 140a below, the third width W3 of the third strip pattern 110x1 and the fourth strip pattern 110y1 as the pick-up electrode pattern remains unchanged. The overlap tolerance may be effectively improved in the subsequent manufacturing process by defining the pick-up electrode pattern in advance.

Figure 5:
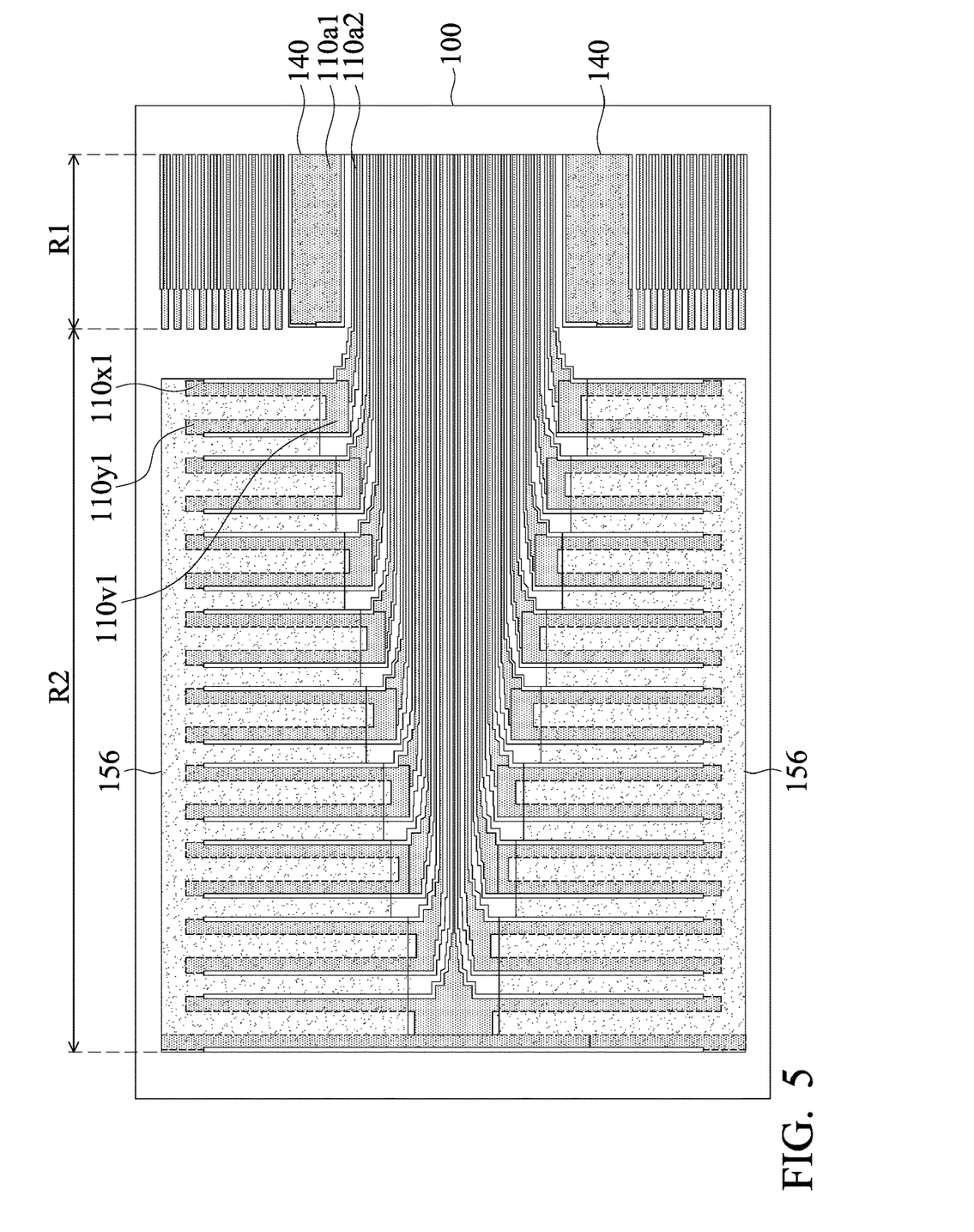
FIG. 5 is a top view of a mask structure for manufacturing a memory device in accordance with an embodiment of the invention.

Please refer to FIG. 5, which is a top view of a mask structure 156 for manufacturing a memory device. The mask structure 156 shown in FIG. 5 corresponds to the mask structure 156 shown in FIGS. 2F, 3F, and 4F. As shown in FIG. 5, the mask structure 156 covers the third strip pattern 110x1, the fourth strip pattern 110y1, and the first strip pattern 110al, which have the third width W3, and the second strip pattern 110a2 and the connection Pattern 110v1 are exposed.

Figure 2H:
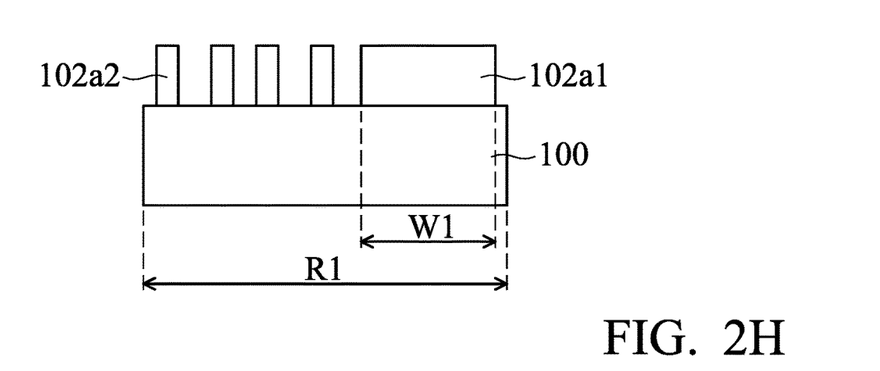
Figure 3H:
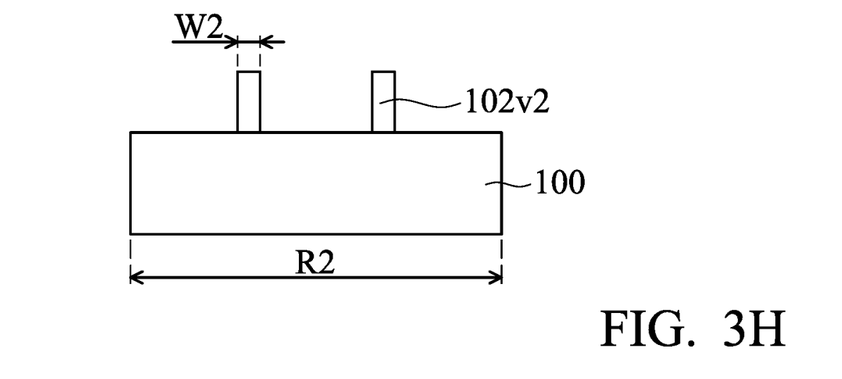
Figure 4H:
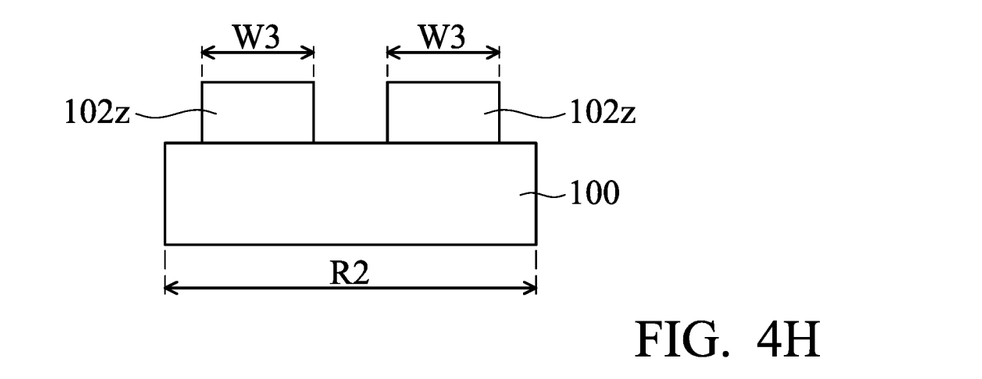

Next, referring to FIGS. 2H, 3H, and 4H, the third pattern in the patterned hard mask layer 110 is transferred to the target layer 102. Using the hard mask layer 110 having the third pattern as an etching mask, the target layer 102 is etched to form the third pattern in the target layer 102.

After the above-mentioned etching is performed, a select gate structure 102a1 having a target width (i.e., a first width W1) and a plurality of word line structures 102a2 having a target width are formed in the memory cell region R1 of the substrate 100, as shown in FIG. 2H. The pick-up electrode structure is formed in the peripheral pick-up area R2 of the substrate 100, which includes a plurality of pick-up electrode strips, and each pick-up electrode strip includes an extension part 102v2 (as shown in FIG. 3H) and a main part 102z (as shown in FIG. 4H). The main part 102z is defined by the third strip pattern 110x1 and the fourth strip pattern 110y1 which have the third width W3.

Figure 6:
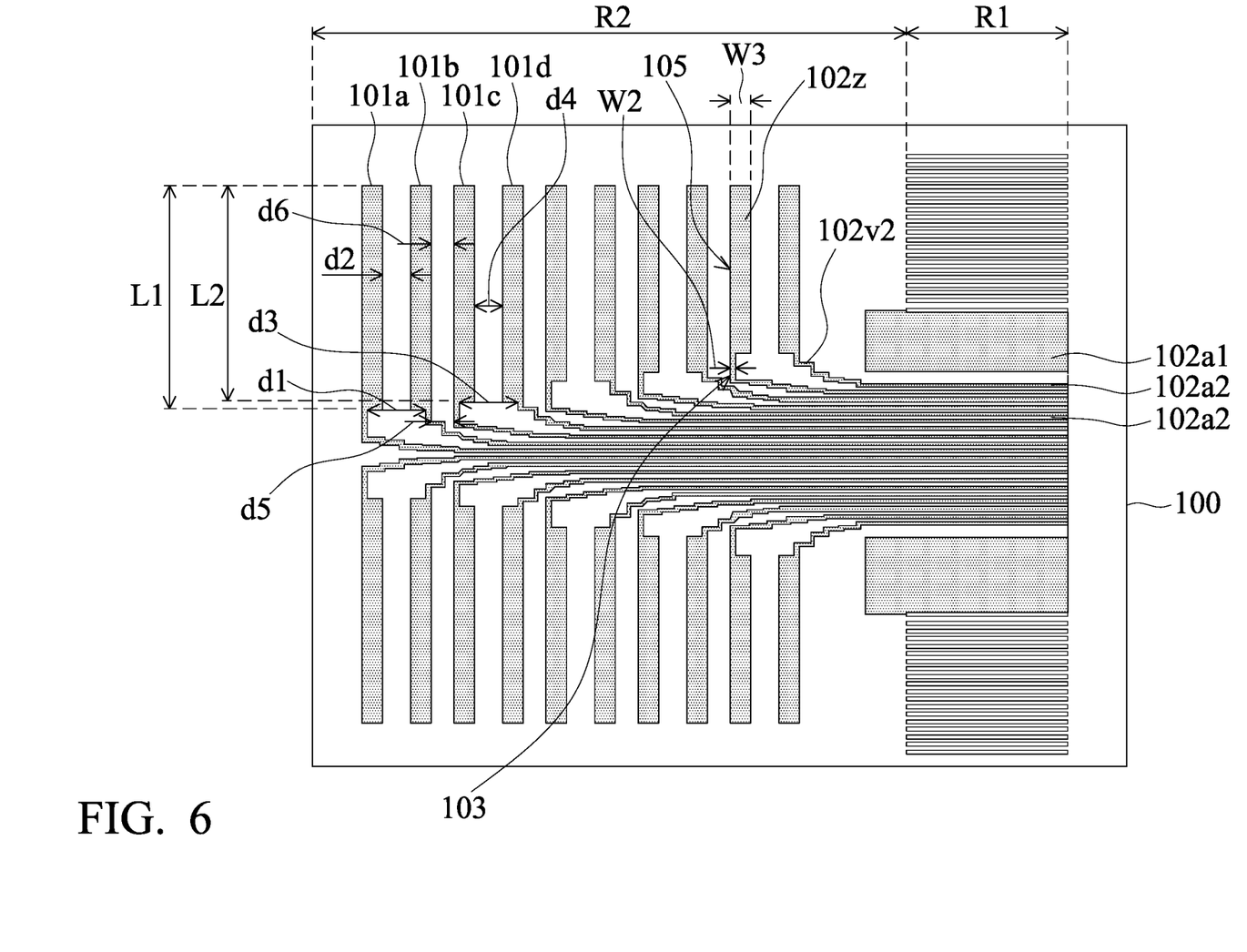
FIG. 6 is a top view of a target layer for manufacturing a memory device in accordance with an embodiment of the invention.

Please refer to FIG. 6, which is a top view of a target layer 102 for manufacturing a memory device. The target layer 102 in FIG. 6 is manufactured by using the methods shown in FIGS. 2A-2H, 3A-3H, and 4A-4H. As shown in FIG. 6, the pick-up electrode strips are parallel to the first direction (for example, the Y direction), and are arranged along a second direction (for example, the X direction) on the substrate 100, in which the second direction is different from the first direction. In order to simplify the drawing, FIG. 6 only shows two pairs of pick-up electrode structures that are symmetrically arranged up and down, and each pair of the pick-up electrode structures includes ten pick-up electrode strips. However, it should be understood that the number of pick-up electrode strips depends on the design requirements and is not intended to be limited to the embodiment shown in FIG. 6.

Each pick-up electrode strip includes an extension part 102v2 and a main part 102z. The main part 102z is deposited in the peripheral pick-up area R2, and the extension part 102v2 extends from the main part 102z to the word line structure 102a2 of the memory cell area R1. The width of the extension part 102v2 (which is substantially equal to the second width W2 of the sixth strip pattern 110v2) is smaller than the width of the main part 102z (which is substantially equal to the third width W3 of the third strip pattern 110x1 and the fourth strip pattern 110y1), and the extension part 102v2 has a side wall surface 103 that is aligned with a side wall surface 105 of the main part 102z.

In order to simplify the description of the configuration of the pick-up electrode structures, only the first pick-up electrode strip 101a, the second pick-up electrode strip 101b, the third pick-up electrode strip 101c, and the fourth pick-up electrode strip 101d arranged in order along the second direction are illustrated. In this embodiment, the main part 102z of the first pick-up electrode strip 101a and the main part 102z of the second pick-up electrode strip 101b have the same first length L1, and the main part 102z of the third pick-up electrode strip 101c and the main part 102z of the fourth pick-up electrode strip 101d have the same second length L2, in which the first length L1 is greater than (or equal to) the second length L2.

The first pick-up electrode strip 101a and the second pick-up electrode strip 101b are arranged symmetrically with each other, and the third pick-up electrode strip 101c and the fourth pick-up electrode strip 101d are arranged symmetrically with each other. In addition, the second pick-up electrode strip 101b and the third pick-up electrode strip 101c are substantially arranged symmetrically to each other. Furthermore, the first pick-up electrode strip 101a, the second pick-up electrode strip 101b, the third pick-up electrode strip 101c, and the fourth pick-up electrode strip 101d both have the third width W3.

The first length d1 between the extension part 102v2 of the first pick-up electrode strip 101a and the extension part 102v2 of the second pick-up electrode strip 101b exceeds the second length d2 between the body part 102z of the first pick-up electrode strip 101a and the main body 102z of the second pick-up electrode strip 101b. The third length d3 between the extension 102v2 of the third pick-up electrode strip 101c and the extension 102v2 of the fourth pick-up electrode strip 101d exceeds the fourth length d4 of the body part 102z of the third pick-up electrode strip 101c and the body part of the fourth pick-up electrode strip 101d.

The fifth length d5 between the extension part 102v2 of the second pick-up electrode strip 101b and the extension part 102v2 of the third pick-up electrode strip 101c is substantially equal to the sixth length d6 between the main part 102z of the second pick-up electrode strip 101b and the main body 102z of the third pick-up electrode 101c, in which the second length d2 is substantially equal to the fourth length d4 and the sixth length d6.

Since the select gate pattern and the fork-shaped pattern are respectively defined in the memory cell area and the peripheral pick-up area before the patterned sacrificial material layer (sacrificial material layer) is removed, the overlap tolerance is effectively improved. When the target widths of the select gate pattern and the fork-shaped pattern are shrank as the size of the memory device shrinks, the original lithography process can still be used instead of the high-resolution lithography process, thereby avoiding increasing the manufacturing cost.

Before etching, a lithography process is adapted to form a plurality of fork-shaped patterns in the peripheral pick-up area as an etching stop layer. Therefore, after the third strip pattern and the fourth strip pattern of the fork-shaped pattern are used to define the pick-up electrode pattern, the target width of the main part of the pick-up electrode pattern can be maintained without being influenced by the overlap shift of the multi-layer resist structure and the pick-up electrode pattern. In this way, the width of the main part of the pick-up electrode strip is consistent with and larger than the width of the extension part, and the main part of the pick-up electrode strip has a paddle shape, so that the contact point can be easily formed above the main part of the pick-up electrode strip. Namely, there may be a robust and reliable electrical connection between the contact and the pick-up electrode strip, thereby increasing the yield and reliability of the memory device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pick-up structure for a memory device, comprising:
a substrate, having a memory cell region and a peripheral pick-up area adjacent to the memory cell area; and
a plurality of pick-up electrode strips, parallel to a first direction, extending along a second direction that is different from the first direction, and arranged on the substrate, wherein each of the pick-up electrode strips comprises:
a main part, deposited in the peripheral pick-up area, wherein the main part is defined by a plurality of fork-shaped patterns in a first mask layer; and
an extension part, extending from the main part to the memory cell region, wherein the extension part has a width less than a width of the main part and the extension part has a side wall surface aligned with a side wall surface of the main part;
wherein the first mask layer, a sacrificial material layer, and a second mask layer are sequentially formed on the substrate;
wherein a first pattern and a second pattern are formed in the second mask layer;
wherein the first pattern corresponds to the memory cell region and comprises a plurality of first strip patterns and a plurality of second strip patterns parallel with one another, and the second pattern corresponds to the peripheral pick-up region and comprises a plurality of fork-shaped patterns connected to the plurality of second strip patterns.

2. The pick-up structure for the memory device as defined in claim 1, wherein each of the fork-shaped patterns comprises a first strip pattern, a second strip pattern, and a connection pattern, the first strip pattern and the second strip pattern are parallel to the first direction and extend along the second direction, and the connection pattern is configured to connect the first strip pattern and the second strip pattern, wherein the first strip pattern and the second strip pattern are configured to define the main part.

3. The pick-up structure for the memory device as defined in claim 1, wherein a multi-layer resist structure covers the first strip pattern and the second strip pattern and is configured to form the extension part connecting the main part through the connection pattern, wherein the first strip pattern and the second strip pattern form the main part.

4. The pick-up structure for the memory device as defined in claim 1, wherein the pick-up electrode strips at least comprise a first pick-up electrode strip, a second pick-up electrode strip, a third pick-up electrode strip, and a fourth pick-up electrode strip arranged along the second direction, wherein the main part of the pick-up electrode strips has the same width.

5. The pick-up structure for the memory device as defined in claim 4, wherein one of the fork-shaped patterns defines the first pick-up electrode strip and the second pick-up electrode strip and another of the fork-shaped patterns defines the third pick-up electrode strip and the fourth pick-up electrode strip.

6. The pick-up structure for the memory device as defined in claim 4, wherein the first pick-up electrode strip and the second pick-up electrode strip are symmetrically arranged with each other and the third pick-up electrode strip and the fourth pick-up electrode strip are symmetrically arranged with each other.

7. The pick-up structure for the memory device as defined in claim 4, wherein the extension part of the first pick-up electrode strip and the extension part of the second pick-up electrode strip are separated with a first length and the main part of the first pick-up electrode strip and the main part of the second pick-up electrode strip are separated with a second length, wherein the first length exceeds the second length.

8. The pick-up structure for the memory device as defined in claim 7, wherein the extension part of the third pick-up electrode strip and the extension part of the fourth pick-up electrode strip are separated with a third length and the main part of the third pick-up electrode strip and the main part of the fourth pick-up electrode strip are separated with a fourth length, wherein the third length exceeds the fourth length and the second length.

9. The pick-up structure for the memory device as defined in claim 7, wherein the extension part of the second pick-up electrode strip and the extension part of the third pick-up electrode strip are separated with a third length and the main part of the second pick-up electrode strip and the main part of the third pick-up electrode strip are separated with a fourth length, wherein the third length is equal to the fourth length and the second length.

10. The pick-up structure for the memory device as defined in claim 1, wherein the pick-up electrode strips at least comprise a first pick-up electrode strip, a second pick-up electrode strip, a third pick-up electrode strip, and a fourth electrode strip arranged along the second direction, wherein, the main part of the first pick-up electrode strip and the main part of the second pick-up electrode strip have the same first length, the main part of the third pick-up electrode strip and the main part of the fourth pick-up electrode strip have the same second length, wherein the first length exceeds the second length.

11. The pick-up structure for the memory device as defined in claim 1,
wherein each of the fork-shaped patterns comprises a third strip pattern, a fourth strip pattern, and a connection pattern, the third strip pattern and the fourth strip pattern are parallel to a first direction, and the connection pattern is configured to connect the third strip pattern and the fourth strip pattern.

12. The pick-up structure for the memory device as defined in claim 11, wherein the first pattern and the second pattern in the second mask layer are transferred to the sacrificial material layer so that the sacrificial material layer has the first strip patterns, the second strip patterns, and the fork-shaped patterns;
wherein the second mask layer having the first pattern and the second pattern is removed;
wherein a plurality of spacer layers on the first mask layer is formed so that there is a corresponding spacer layer on two opposite side walls of each of the first strip patterns and two opposite side walls of each of the second strip patterns in the sacrificial material layer.

13. The pick-up structure for the memory device as defined in claim 12, wherein a first etching on the first mask layer is performed by using the sacrificial material layer and the spacer layers as an etching mask;
wherein after the first etching, the sacrificial material layer is removed to leave the spacer layers;
wherein a second etching on the first mask layer is performed by using the spacer layers as an etching mask so that the first mask layer has a third pattern.

14. The pick-up structure for the memory device as defined in claim 13, wherein before the second etching, a multi-layer resist structure is formed on the substrate to cover the spacer layers and the first mask layer so that the spacer layers and the multi-layer resist structure are configured as the etching mask during the second etching.

15. The pick-up structure for the memory device as defined in claim 14, wherein the multi-layer resist structure further covers the spacer layers of the first strip patterns, the third strip pattern, and the fourth pattern and the first mask layer so that the connection pattern is removed during the second etching.

* * * * *